(12) United States Patent
Son

(10) Patent No.: US 12,453,179 B2
(45) Date of Patent: Oct. 21, 2025

(54) DISPLAY DEVICE

(71) Applicant: LG Display Co., Ltd., Seoul (KR)

(72) Inventor: KyungMo Son, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 642 days.

(21) Appl. No.: 17/497,490

(22) Filed: Oct. 8, 2021

(65) Prior Publication Data

US 2022/0209181 A1 Jun. 30, 2022

(30) Foreign Application Priority Data

Dec. 24, 2020 (KR) .......................... 10-2020-0183513

(51) Int. Cl.
H10D 86/40 (2025.01)
H10D 86/60 (2025.01)
H10K 50/844 (2023.01)
H10K 59/121 (2023.01)
H10K 59/124 (2023.01)
H10K 59/80 (2023.01)

(52) U.S. Cl.
CPC ......... *H10D 86/411* (2025.01); *H10K 50/844* (2023.02); *H10K 59/1213* (2023.02); *H10K 59/124* (2023.02); *H10D 86/451* (2025.01); *H10D 86/60* (2025.01); *H10K 59/8731* (2023.02)

(58) Field of Classification Search
CPC ............. H10K 59/1213; H10K 59/123; H10K 59/124; H10K 59/8731; H10K 50/844; H01L 27/1225; H01L 27/1218; H01L 27/122; H01L 27/124; H10D 86/411; H10D 86/423; H10D 86/441; H10D 86/60; H10D 86/451
See application file for complete search history.

(56) References Cited

U.S. PATENT DOCUMENTS

| 2019/0074479 | A1* | 3/2019 | Lee | ...................... H10K 50/844 |
| 2020/0176520 | A1 | 6/2020 | Kim et al. | |
| 2020/0365672 | A1* | 11/2020 | Choi | ..................... H10K 59/122 |
| 2021/0143365 | A1* | 5/2021 | Jo | ......................... H10K 50/844 |
| 2022/0005903 | A1* | 1/2022 | Kim | ................... H10K 59/8731 |
| 2024/0023365 | A1 | 1/2024 | Choi et al. | |

FOREIGN PATENT DOCUMENTS

| KR | 10-2017-0059864 A | 5/2017 |
| KR | 10-2020-0067576 A | 6/2020 |

* cited by examiner

Primary Examiner — Vongsavanh Sengdara
(74) Attorney, Agent, or Firm — Fenwick & West LLP

(57) ABSTRACT

A display device comprises a substrate having an active region and an outer region surrounding the active region, a substrate hole provided in the active region of the substrate, a separation area positioned between the active region and the substrate hole, a first thin film transistor provided in the active region, a first interlayer insulating layer covering a first gate electrode of the first thin film transistor, a first intermediate insulating layer on the first interlayer insulating layer, a second thin film transistor positioned on the first intermediate insulating layer, a second interlayer insulating layer covering a second gate electrode of the second thin film transistor and extending to the separation area, and a second intermediate insulating layer covering an upper portion of the second interlayer insulating layer and extending to the separation area. The second intermediate insulating layer has different thicknesses in the active region and the separation area.

9 Claims, 5 Drawing Sheets

DISPLAY DEVICE

CROSS-REFERENCE TO RELATED APPLICATIONS

This application claims the benefit of and priority to Korean Patent Application No. 10-2020-0183513 filed on Dec. 24, 2020, in the Republic of Korea, the entire contents of which are hereby expressly incorporated by reference into the present application.

BACKGROUND

Technical Field

The present disclosure relates to a display device including a substrate hole that penetrates a substrate.

Discussion of the Related Art

Recently, as our society advances toward an information-oriented society, the field of display devices for visually expressing an electrical information signal has rapidly advanced. Various display devices having excellent performance in terms of thinness, lightness, and low power consumption, are being developed correspondingly.

In general, electronic devices such as monitors, TVs, laptops, and digital cameras include a display device that implements an image. For example, the display device may include light emitting elements. Each light emitting element can emit light having a specific color. For example, each light emitting element may include a light emitting layer positioned between a first electrode and a second electrode.

The display device may have peripheral devices that are built therein, such as a camera, a speaker, and a sensor. For example, the display device may include a substrate hole that penetrates an element substrate supporting the light emitting elements. The substrate hole may be positioned between the light emitting elements. The peripheral devices may be inserted into the substrate hole.

However, in the display device, external moisture may penetrate through the substrate hole. The external moisture penetrating through the substrate hole may move to the light emitting elements adjacent to the substrate hole through the light emitting layer. Accordingly, in the display device, the light emitting elements adjacent to the substrate hole may be damaged by external moisture that has penetrated through the substrate hole.

SUMMARY

An aspect of the present disclosure is to provide a display device capable of preventing damage to a light emitting element due to external moisture penetrating through a substrate hole.

Another aspect of the present disclosure is to provide a display device capable of improving the reliability of an active layer of a transistor that drives a light emitting element.

Objects of the present disclosure are not limited to the above-mentioned objects, and other objects, which are not mentioned above, can be clearly understood by those skilled in the art from the following descriptions.

A display device according to an exemplary embodiment of the present disclosure may include a substrate having an active area and an outer area surrounding the active area. A substrate hole may be provided in the active region of the substrate. A separation area may be positioned between the active region and the substrate hole. A first thin film transistor may be positioned in the active region. A first interlayer insulating layer covering a first gate electrode of the first thin film transistor may be included. A first intermediate insulating layer may be positioned on the first interlayer insulating layer. A second thin film transistor may be positioned on the first intermediate insulating layer. A second interlayer insulating layer covering a second gate electrode of the second thin film transistor and extending to the separation area may be included. A second intermediate insulating layer covering an upper portion of the second interlayer insulating layer and extending to the separation area may be included. The second intermediate insulating layer may have different thicknesses in the active region and the separation area.

Other detailed matters of the exemplary embodiments are included in the detailed description and the drawings.

According to the present disclosure, deterioration of an oxide semiconductor layer is minimized by differently forming thicknesses of an insulating layer under a separation structure in a separation area of a substrate hole area and an insulating layer containing hydrogen on the oxide semiconductor layer of a display device according to an exemplary embodiment of the present disclosure, so that device reliability can be improved. In addition, it is possible to prevent defects due to moisture permeation by separating a light emitting layer by the separation structure, so that a highly reliable display device can be provided.

The effects according to the present disclosure are not limited to the contents exemplified above, and more various effects are included in the present specification.

DETAILED DESCRIPTION OF THE EXEMPLARY EMBODIMENTS

Figure 1:
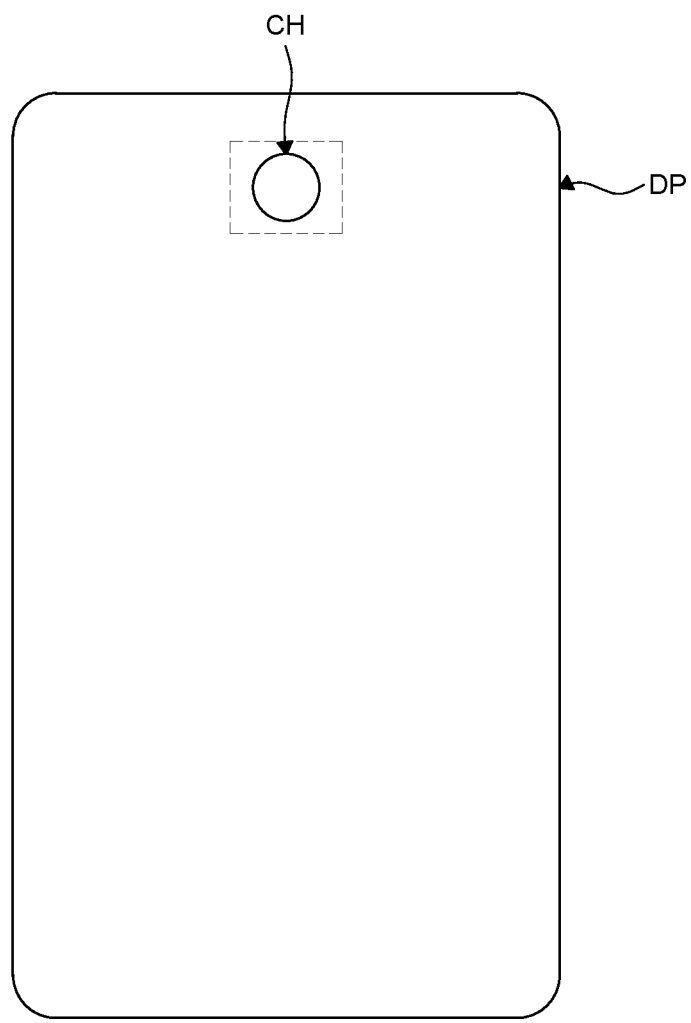
FIG. 1 is a view schematically illustrating a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

Figure 2:
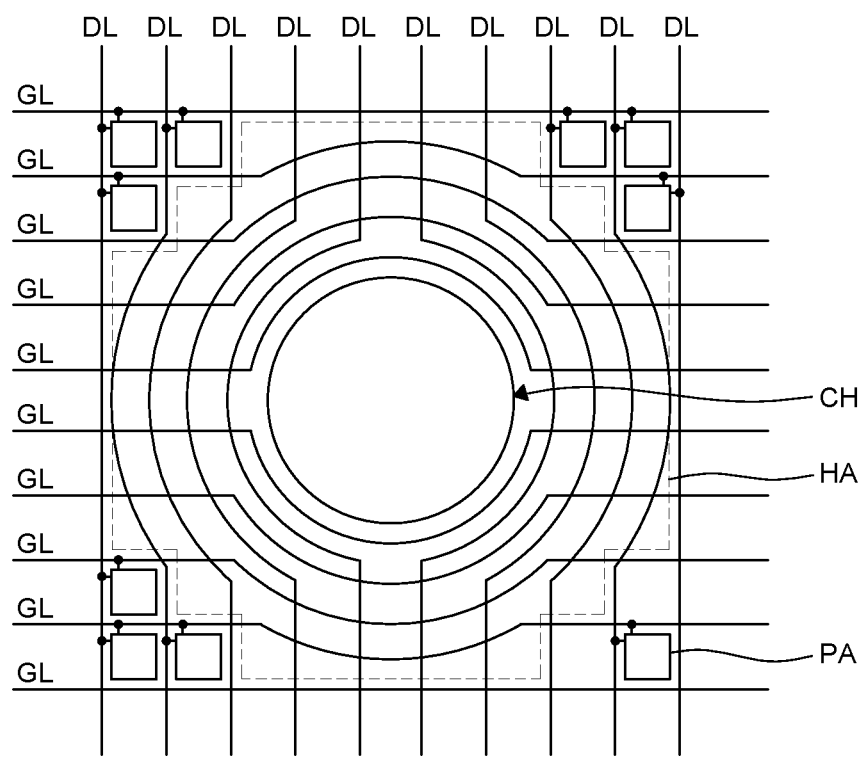
FIG. 2 is an enlarged view of a periphery of a substrate hole in the display device according to an exemplary embodiment of the present disclosure.
Figure 3:
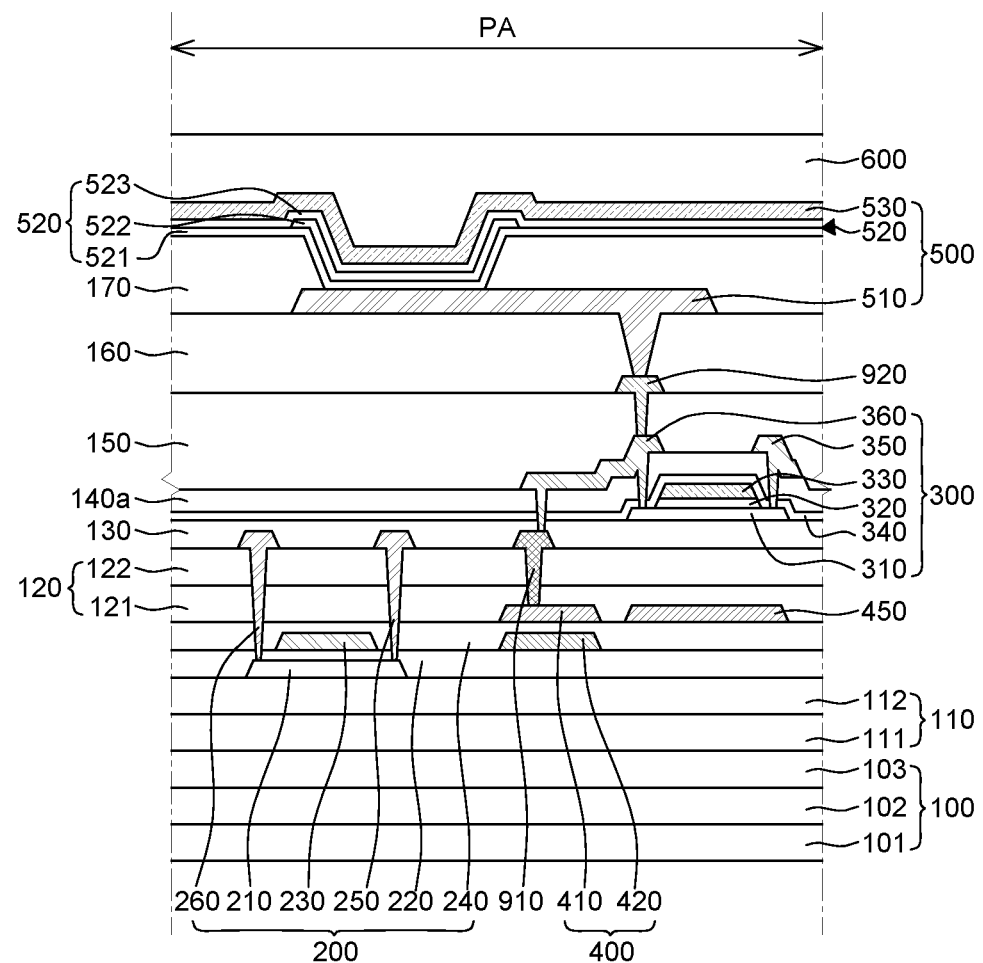
FIG. 3 is a view illustrating a cross-section of a pixel in the display device according to an exemplary embodiment of the present disclosure.
Figure 4:
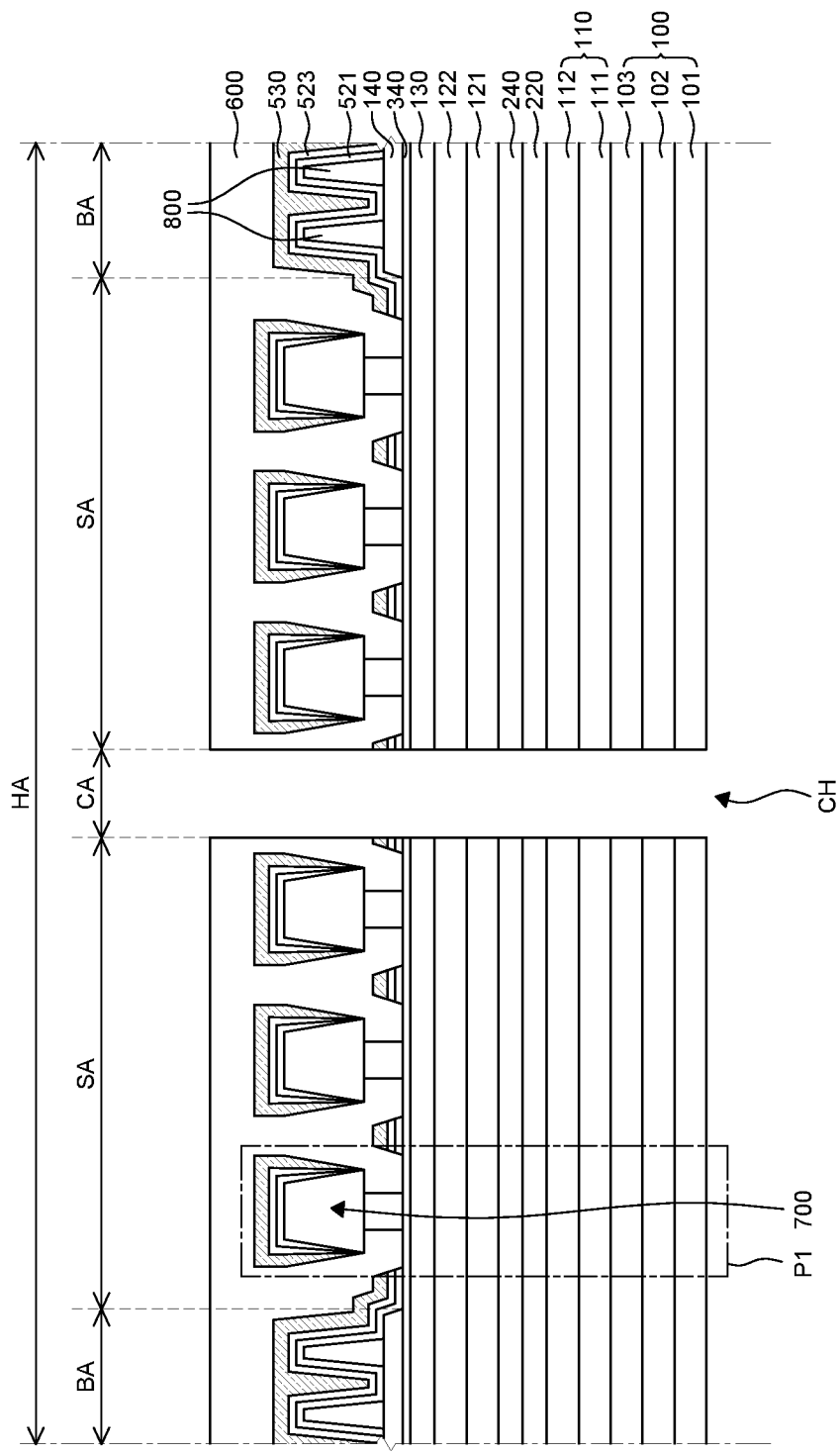
FIG. 4 is a view illustrating a cross-section of a peripheral area of the substrate hole in the display device according to an exemplary embodiment of the present disclosure.
Figure 5:
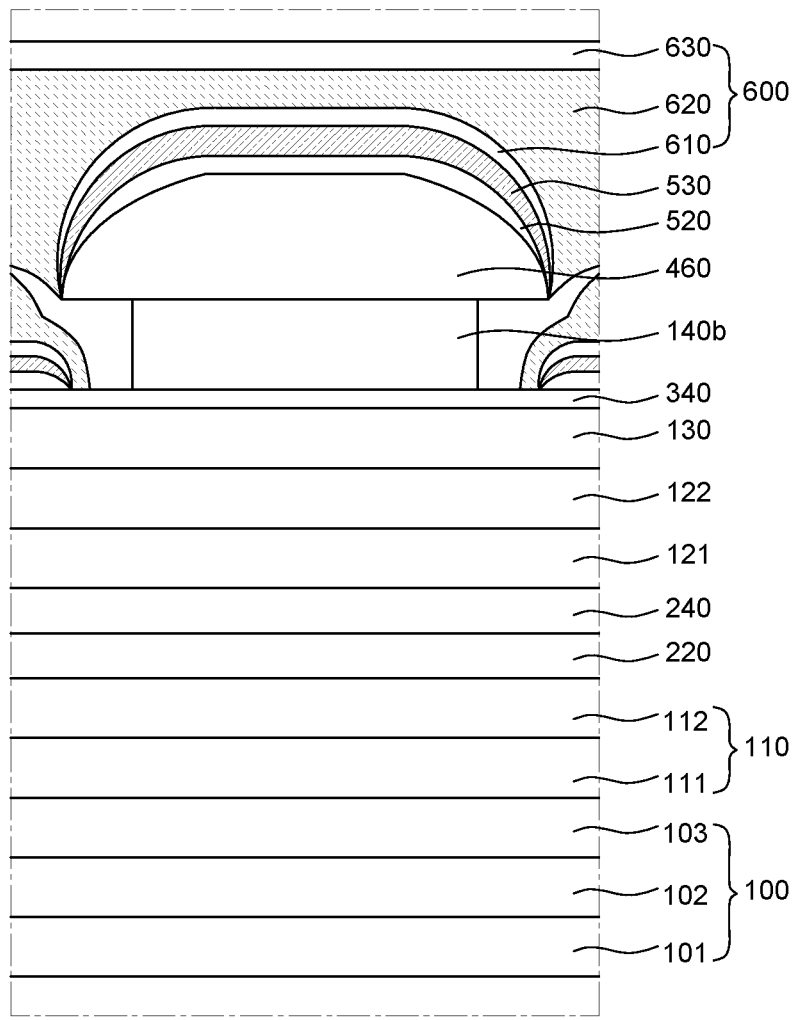
FIG. 5 is an enlarged view of region P1 of FIG. 4.

FIG. 1 is a view schematically illustrating a display device according to an exemplary embodiment of the present disclosure. FIG. 2 is an enlarged view of a periphery of a substrate hole in the display device according to an exemplary embodiment of the present disclosure. FIG. 3 is a view illustrating a cross-section of a pixel in the display device according to an exemplary embodiment of the present disclosure. FIG. 4 is a view illustrating a cross-section of a peripheral area of the substrate hole in the display device according to an exemplary embodiment of the present disclosure. FIG. 5 is an enlarged view of region P1 of FIG. 4.

Referring to FIGS. 1 to 5, a display device DP according to an exemplary embodiment of the present disclosure may include an element substrate 100. The element substrate 100 may include an insulating material. For example, the element substrate 100 may include glass or plastic. The element substrate 100 may have a multilayer structure. For example, the element substrate 100 may have a structure in which an insulating layer 102 is positioned between a first substrate layer 101 and a second substrate layer 103. The second substrate layer 103 may include the same material as the first substrate layer 101. For example, the first substrate layer 101 and the second substrate layer 103 may include plastic. The insulating layer 102 may include an insulating material.

The element substrate 100 may include pixels PA that are defined by gate lines GL and data lines DL. Light emitting elements 500 may be positioned in the respective pixels PA. Each of the light emitting elements 500 may emit light having a specific color.

For example, each light emitting element 500 may include a first electrode 510, a light emitting layer 520, and a second electrode 530 that are sequentially stacked.

The first electrode 510 may include a conductive material. The first electrode 510 may include a metal having a relatively high reflectance. The first electrode 510 may have a multilayer structure. For example, the first electrode 510 may have a structure in which a reflective electrode formed of a metal such as aluminum (Al) and silver (Ag) is positioned between transparent electrodes formed of a transparent conductive material such as ITO and IZO.

The light emitting layer 520 may generate light having a luminance corresponding to a voltage difference between the first electrode 510 and the second electrode 530. For example, the light emitting layer 520 may include a light emitting material layer (EML) 522 including a light emitting material. The light emitting material may include an organic material, an inorganic material, or a hybrid material. For example, the display device according to technical ideas of the present disclosure may be an organic light emitting display device including the light emitting layer 520 that is formed of an organic material.

The light emitting layer 520 may have a multilayer structure to increase luminous efficiency. For example, the light emitting layer 520 may further include at least one first organic layer 521 positioned between the first electrode 510 and the light emitting material layer 522 and at least one second organic layer 523 positioned between the light emitting material layer 522 and the second electrode 530. The first organic layer 521 may include at least one of a hole injection layer HIL and a hole transport layer HTL. In addition, the second organic layer 523 may include at least one of an electron transport layer ETL and an electron injection layer EIL. However, the present disclosure is not limited thereto. For example, the first organic layer 521 may include at least one of an electron transport layer ETL and an electron injection layer EIL, and the second organic layer 523 may include at least one of a hole injection layer HIL and a hole transport layer HTL.

The second electrode 530 may include a conductive material. The second electrode 530 may include a material that is different from that of the first electrode 510. For example, the second electrode 530 may be a transparent electrode formed of a transparent conductive material such as ITO and IZO. Accordingly, in the display device according to an exemplary embodiment of the present disclosure, light that is generated by the light emitting layer 520 of each pixel PA may be emitted to the outside through the second electrode 530.

Each light emitting element 500 may be supplied with a driving current corresponding to a gate signal applied through the gate line GL corresponding thereto and a data signal applied through the data line DL corresponding thereto. For example, in each pixel PA, a driving circuit electrically connected to the light emitting element 500 corresponding thereto may be positioned. The driving circuit may control an operation of the corresponding light emitting element 500 according to the gate signal and the data signal.

For example, the driving circuit may include a first thin film transistor 200, a second thin film transistor 300, and a storage capacitor 400.

The first thin film transistor 200 may include a first semiconductor pattern 210, a first gate insulating layer 220, a first gate electrode 230, a first interlayer insulating layer 240, a first source electrode 250, and a first drain electrode 260.

The first semiconductor pattern 210 may be positioned close to the element substrate 100. The first semiconductor pattern 210 may include a semiconductor material. For example, the first semiconductor pattern 210 may include poly-silicon (Poly-Si), which is a polycrystalline semiconductor material. In the exemplary embodiment of the present disclosure, the first semiconductor pattern 210 includes low temperature Poly-Si (LTPS).

The first semiconductor pattern 210 may include a first source region, a first drain region, and a first channel region. The first channel region may be positioned between the first source region and the first drain region. The first channel region may have a relatively lower conductivity than the first source region and the first drain region. For example, the content of conductivity-type impurities may be higher in the first source region and the first drain region than in the first channel region.

The first gate insulating layer 220 may be positioned on the first semiconductor pattern 210. The first gate insulating layer 220 may extend in an outer direction of the first semiconductor pattern 210. The first gate insulating layer 220 may include an insulating material. For example, the first gate insulating layer 220 may include a silicon oxide-based (SiOx) material. The silicon oxide-based (SiOx) material may include silicon dioxide (SiO2).

The first gate electrode 230 may be positioned on the first gate insulating layer 220. For example, the first gate electrode 230 may overlap the first channel region of the first semiconductor pattern 210. The first gate electrode 230 may be insulated from the first semiconductor pattern 210 by the first gate insulating layer 220. The first gate electrode 230 may include a conductive material. For example, the first gate electrode 230 may include a metal such as aluminum (Al), chromium (Cr), copper (Cu), titanium (Ti), molybdenum (Mo), or tungsten (W).

The first interlayer insulating layer 240 may be disposed on the first gate insulating layer 220 and the first gate electrode 230. The first interlayer insulating layer 240 may extend along the first gate insulating layer 220. The first interlayer insulating layer 240 may include an insulating material. The first interlayer insulating layer 240 may include a material that is different from that of the first gate insulating layer 220. For example, the first interlayer insulating layer 240 may include a silicon nitride-based material (SiNx).

The first source electrode 250 may be positioned on the first interlayer insulating layer 240. The first source electrode 250 may be electrically connected to the first source region of the first semiconductor pattern 210. For example, the first interlayer insulating layer 240 may include a first source contact hole that partially exposes the source region of the first semiconductor pattern 210. The first source electrode 250 may include an area overlapping the source region of the first semiconductor pattern 210.

The first source electrode 250 may include a conductive material. For example, the first source electrode 250 may include a metal such as aluminum (Al), chromium (Cr), molybdenum (Mo), tungsten (W), and copper (Cu).

The first drain electrode 260 may be positioned on the first interlayer insulating layer 240. The first drain electrode 260 may be electrically connected to the first drain region of the first semiconductor pattern 210. For example, the first interlayer insulating layer 240 may include a first drain contact hole that partially exposes the drain region of the first semiconductor pattern 210. The first drain electrode 260 may include an area overlapping the drain region of the first semiconductor pattern 210.

The first drain electrode 260 may include a conductive material. For example, the first drain electrode 260 may include a metal such as aluminum (Al), chromium (Cr), molybdenum (Mo), tungsten (W), and copper (Cu). The first drain electrode 260 may include the same material as the first source electrode 250. For example, the first drain electrode 260 may be formed by the same process as the first source electrode 250.

The first source electrode 250 and the first drain electrode 260 may be formed in a multilayer structure. For example, the first source electrode 250 and the first drain electrode 260 may be formed in a triple layer. When the first source electrode 250 and the first drain electrode 260 are formed in a triple layer, a lower layer and an upper layer thereof may be formed of an aluminum (Al) metal layer, and an intermediate layer thereof positioned between the lower layer and the upper layer may be composed of a titanium (Ti) metal layer. The second thin film transistor 300 may be formed through a process that is different from that of the first thin film transistor 200. For example, the second thin film transistor may be positioned on a separation insulating layer 130 covering the first source electrode 250 and the first drain electrode 260 of the first thin film transistor 200. The separation insulating layer 130 may include an insulating material. The separation insulating layer 130 may include a material that is different from that of the first interlayer insulating layer 240. For example, the separation insulating layer 130 may include a silicon oxide-based (SiOx) material. A structure of the second thin film transistor 300 may be the same as that of the first thin film transistor 200. For example, the second thin film transistor 300 may include a second semiconductor pattern 310, a second gate insulating layer 320, a second gate electrode 330, a second interlayer insulating layer 340, a second source electrode 350, and a second drain electrode 360.

The second semiconductor pattern 310 may be positioned close to the separation insulating layer 130. For example, the second semiconductor pattern 310 may directly contact the separation insulating layer 130. The second semiconductor pattern 310 may include a semiconductor material. The second semiconductor pattern 310 may include a material that is different from that of the first semiconductor pattern 210. For example, the second semiconductor pattern 310 may include an oxide semiconductor such as IGZO.

The second semiconductor pattern 310 may include a second source region, a second drain region, and a second channel region. The second channel region may be positioned between the second source region and the second drain region. A resistance of the second source region and a resistance of the second drain region may be lower than a resistance of the second channel region. For example, the second source region and the second drain region may be conductive regions. The second channel region may be an unconducted region.

The second gate insulating layer 320 may be positioned on the second semiconductor pattern 310. The second gate insulating layer 320 may include an insulating material. For example, the second gate insulating layer 320 may include a silicon oxide-based (SiOx) material, a silicon nitride-based (SiNx) material, and/or a material having a high dielectric constant (a high-K material). The second gate insulating layer 320 may have a multilayer structure.

The second gate insulating layer 320 may expose the second source region and the second drain region of the second semiconductor pattern 310. The second source region and the second drain region of the second semiconductor pattern 310 may not overlap the second gate insulating layer 320. For example, the source region and the drain region of the second semiconductor pattern 310 may be conductive by an etchant used in a patterning process of the second gate insulating layer.

The second gate electrode 330 may be positioned on the second gate insulating layer 320. For example, the second gate electrode 330 may overlap the second channel region of the second semiconductor pattern 310. The second gate electrode 330 may include a conductive material. For example, the second gate electrode 330 may include a metal such as aluminum (Al), chromium (Cr), copper (Cu), titanium (Ti), molybdenum (Mo), or tungsten (W). The second gate electrode 330 may include the same material as the first gate electrode 230.

The second interlayer insulating layer 340 may be positioned on the second semiconductor pattern 310 and the second gate electrode 330. The second interlayer insulating layer 340 may cover a side surface of the second semiconductor pattern 310. The second interlayer insulating layer 340 may include an insulating material. The second interlayer insulating layer 340 may include a material that is different from that of the first interlayer insulating layer 240. For example, the second interlayer insulating layer 340 may include a silicon oxide-based material (SiOx).

The second source electrode 350 may be positioned on the second interlayer insulating layer 340. The second source electrode 350 may be electrically connected to the source region of the second semiconductor pattern 310. For example, the second interlayer insulating layer 340 may include a second source contact hole that partially exposes the source region of the second semiconductor pattern 310. The second source electrode 350 may include an area overlapping the source region of the second semiconductor pattern 310.

The second source electrode 350 may include a conductive material. For example, the second source electrode 350 may include a metal such as aluminum (Al), chromium (Cr), molybdenum (Mo), tungsten (W), and copper (Cu). The second source electrode 350 may include the same material as the first source electrode 250.

The second drain electrode 360 may be positioned on the second interlayer insulating layer 340. The second drain electrode 360 may be electrically connected to the drain region of the second semiconductor pattern 310. For example, the second interlayer insulating layer 340 may include a second drain contact hole that partially exposes the drain region of the second semiconductor pattern 310. The second drain electrode 360 may include an area overlapping the drain region of the second semiconductor pattern 310.

The second drain electrode 360 may include a conductive material. For example, the second drain electrode 360 may include a metal such as aluminum (Al), chromium (Cr), molybdenum (Mo), tungsten (W), and copper (Cu). The second drain electrode 360 may include the same material as the second source electrode 350. For example, the second drain electrode 360 may be formed by the same process as the second source electrode 350.

The second source electrode 350 and the second drain electrode 360 may be formed in a multilayer structure. For example, the second source electrode 350 and the second drain electrode 360 may be formed in a triple layer. When the second source electrode 350 and the second drain electrode 360 are formed in a triple layer, a lower layer and an upper layer thereof may be formed of an aluminum (Al) metal layer, and an intermediate layer thereof positioned between the lower layer and the upper layer may be composed of a titanium (Ti) metal layer.

The storage capacitor 400 may be formed between the element substrate 100 and the second thin film transistor 300. For example, the storage capacitor 400 may include a first storage electrode 410 positioned on the same layer as the first gate electrode 230 and a second storage electrode 420 positioned on the first storage electrode 410.

The first storage electrode 410 may include a conductive material. The first storage electrode 410 may include a metal such as aluminum (Al), chromium (Cr), molybdenum (Mo), tungsten (W), and copper (Cu). The first storage electrode 410 may include the same material as the first gate electrode 230. For example, the first storage electrode 410 may be formed by the same process as the first gate electrode 230.

The second storage electrode 420 may include a conductive material. The second storage electrode 420 may include a metal such as aluminum (Al), chromium (Cr), molybdenum (Mo), tungsten (W), and copper (Cu). The first interlayer insulating layer 240 may extend between the first storage electrode 410 and the second storage electrode 420. The second storage electrode 420 may be positioned on the first interlayer insulating layer 240. The first source electrode 250 and the first drain electrode 260 may be positioned on layers different from that of the first storage electrode 420. For example, a first intermediate insulating layer 120 covering the second storage electrode 420 may extend between the first interlayer insulating layer 240 and the first source electrode 250 and between the first interlayer insulating layer 240 and the first drain electrode 260. The first interlayer insulating layer 240 and the first intermediate insulating layer 120 may be stacked sequentially between the first gate electrode 230 and the first source electrode 250 and between the first gate electrode 230 and the first drain electrode 260. The second storage electrode 420 may include a material that is different from that of the first source electrode 250 and the first drain electrode 260.

The first intermediate insulating layer 120 may include an insulating material. For example, the first intermediate insulating layer 120 may include a silicon oxide-based material (SiOx) and/or a silicon nitride-based material (SiNx). The first intermediate insulating layer 120 may have a multilayer structure. For example, the first intermediate insulating layer 120 may have a stacked structure of a first intermediate layer 121 including a silicon oxide-based (SiOx) material and a second intermediate layer 122 including a silicon nitride-based (SiNx) material. The first source electrode 250 and the first drain electrode 260 may be positioned on the second intermediate layer 122. However, the present disclosure is not limited thereto. For example, the first intermediate insulating layer 120 may be formed as a single layer. When the first intermediate insulating layer 120 is formed as a single layer, it may be formed of the second intermediate layer 122 including a silicon nitride-based (SiNx) material.

The second storage electrode 420 may be electrically connected to the second drain electrode 360 of the second thin film transistor 300. For example, a first intermediate electrode 910 that passes through the first intermediate insulating layer 120 and is connected to the second storage electrode 420 may be positioned on the second intermediate layer 122, and the second drain electrode 360 may pass through the second intermediate layer 122 and be connected to the first intermediate electrode 910. The first intermediate electrode 910 may include a conductive material. For example, the first intermediate electrode 910 may include a metal such as aluminum (Al), chromium (Cr), molybdenum (Mo), tungsten (W), and copper (Cu). The first intermediate electrode 910 may include the same material as the first source electrode 250 and the first drain electrode 260. For example, the first intermediate electrode 910 may be formed by the same process as the first source electrode 250 and the first drain electrode 260.

A light blocking electrode 450 may be positioned between the first interlayer insulating layer 240 and the first intermediate insulating layer 120. The light blocking electrode 450 may overlap the second semiconductor pattern 310. The light blocking electrode 450 may prevent a change in characteristics of the second semiconductor pattern 310 due to external light. For example, the light blocking electrode 450 may include a metal. The light blocking electrode 450 may include the same material as the second storage electrode 420. For example, the light blocking electrode 450 may be formed by the same process as the second storage electrode 420.

A second intermediate insulating layer 140a may be positioned on the second interlayer insulating layer 340, and the second source electrode 350 and the second drain electrode 360. The second source electrode 350 and the second drain electrode 360 may be positioned on the second intermediate insulating layer 140a. The second intermediate insulating layer 140a may include an insulating material. The second intermediate insulating layer 140a may include a material that is different from that of the second interlayer insulating layer 340. For example, the second intermediate insulating layer 140a may include a silicon nitride-based (SiNx) material. The second drain electrode 360 may penetrate the second interlayer insulating layer 340 and the second intermediate insulating layer 140a.

A buffer insulating layer 110 may be positioned between the element substrate 100 and the driving circuit of each pixel PA. The buffer insulating layer 110 may prevent contamination by the element substrate 100 in a process of forming the driving circuit. For example, the buffer insulating layer 110 may extend between the element substrate 100 and the first semiconductor pattern 210 of each pixel PA. The buffer insulating layer 110 may include an insulating material. For example, the buffer insulating layer 110 may include a silicon oxide-based (SiOx) material and/or a silicon nitride-based (SiNx) material. The buffer insulating layer 110 may have a multilayer structure. For example, the buffer insulating layer 110 may have a stacked structure of a first buffer layer 111 and a second buffer layer 112 including a material that is different from that of the first buffer layer 111.

A first overcoat layer 150 and a second overcoat layer 160 may be sequentially stacked between the light emitting element 500 and the second thin film transistor 300 of each pixel PA. The first overcoat layer 150 and the second overcoat layer 160 may remove a step difference due to the driving circuit of each pixel PA. For example, a surface of the second overcoat layer 160 facing the light emitting element 500 of each pixel PA may be a flat surface. The first overcoat layer 150 and the second overcoat layer 160 may include an insulating material. The first overcoat layer 150 and the second overcoat layer 160 may include a material that is different from that of the second intermediate insulating layer 140a. For example, the first overcoat layer 150 and the second overcoat layer 160 may include an organic insulating material. The second overcoat layer 160 may include a material that is different from that of the first overcoat layer 150.

The light emitting element 500 of each pixel PA may be electrically connected to the second thin film transistor 300 of the corresponding pixel PA. For example, the first electrode 510 of each pixel PA may pass through the first overcoat layer 150 and the second overcoat layer 160 and be electrically connected to the second drain electrode 360. The first electrode 510 of each pixel PA may be electrically connected to the second drain electrode 360 through a second intermediate electrode 920. For example, the second intermediate electrode 920 may be positioned between the first overcoat layer 150 and the second overcoat layer 160. The second intermediate electrode 920 may pass through the first overcoat layer 150 and be connected to the second drain electrode 360, and the first electrode 510 may pass through the second overcoat layer 160 and be connected to the second intermediate electrode 920.

The second intermediate electrode 920 may include a conductive material. For example, the second intermediate electrode 920 may include a metal such as aluminum (Al), chromium (Cr), molybdenum (Mo), tungsten (W), and copper (Cu). The second intermediate electrode 920 may include a material that is different from that of the first intermediate electrode 910.

The light emitting element 500 of each pixel PA may be driven independently. For example, the first electrode 510 of each pixel PA may be insulated from the first electrode 510 of another pixel PA adjacent to the pixel PA. An edge of each first electrode 510 may be covered by a bank insulating layer 170. The bank insulating layer 170 may be positioned on the second overcoat layer 160. The light emitting layer 520 and the second electrode 530 of each pixel PA may be stacked on the corresponding first electrode 510 exposed by the bank insulating layer 170. The bank insulating layer 170 may include an insulating material. For example, the bank insulating layer 170 may include an organic insulating material. The bank insulating layer 170 may include a material that is different from that of the second overcoat layer 160.

At least a portion of the light emitting layer 520 of each pixel PA may extend on the bank insulating layer 170. For example, the first organic layer 521 and the second organic layer 523 of each pixel PA may be connected to the first organic layer 521 and the second organic layer 523 of the adjacent pixel PA. The light emitting material layer 522 of each pixel PA may be spaced apart from the light emitting material layer 522 of the adjacent pixel PA. The second electrode 530 of each pixel PA may extend on the bank insulating layer 170. For example, the second electrode 530 of each pixel PA may be connected to the second electrode 530 of the adjacent pixel PA.

An encapsulation layer 600 is positioned on the second electrode 530. The encapsulation layer 600 prevents penetration of oxygen and moisture from the outside in order to prevent oxidation of a light emitting material and an electrode material. When the light emitting layer 520 is exposed to moisture or oxygen, a pixel shrinkage phenomenon in which a light emitting area is reduced may occur or a dark spot may occur in the light emitting area. The encapsulation layer is comprised of an inorganic film formed of glass, metal, aluminum oxide (AlOx) or a silicon (Si)-based material, or may have a structure in which an organic layer 620 and inorganic layers 610 and 630 are alternately stacked. In this case, the inorganic layers 610 and 630 serve to block penetration of moisture or oxygen, and the organic layer 620 serves to planarize surfaces of the inorganic layers 610 and 630. When the encapsulation layer is formed as a multilayered thin film, a path of movement of moisture or oxygen is longer and more complicated as compared to the case of a single layer, so penetration of moisture/oxygen to an organic light emitting element becomes difficult.

A barrier film may be positioned on the encapsulation layer 600 to encapsulate an entirety of the element substrate. The barrier film may be a retardation film or a photoisotropic film. In this case, an adhesive layer may be positioned between the barrier film and the encapsulation layer 600. The adhesive layer bonds the encapsulation layer 600 and the barrier film. The adhesive layer may be a heat-curable adhesive or a naturally-curable adhesive. For example, the adhesive layer may be formed of a material such as a barrier pressure sensitive adhesive (B-PSA).

According to an exemplary embodiment of the present disclosure, the second thin film transistor 300 may serve as a driving transistor. Accordingly, the first electrode 510 of the light emitting element 500 may be connected to the second thin film transistor 300, but is not limited thereto. For example, the first electrode 510 of the light emitting element 500 may be connected to the first thin film transistor 200. In addition, the first thin film transistor 200 may serve as a driving transistor.

A substrate hole CH may be formed in the element substrate 100. The substrate hole CH may pass through the element substrate 100. The substrate hole CH may be positioned between the pixels PA. For example, the substrate hole CH may be formed between the light emitting elements 500. The element substrate 100 may include a hole peripheral area HA including an area where the substrate hole CH is formed. The light emitting elements 500 may be positioned outside the hole peripheral area HA. In the hole peripheral area HA, the gate line GL and the data line DL may bypass along an edge of the substrate hole CH.

The hole peripheral area HA may include a through area CA in which the substrate hole CH is formed and a separation area SA surrounding the through area CA. For example, the separation area SA may be positioned between the through area CA and the pixels PA. The hole peripheral area HA may further include a barrier area BA positioned outside the separation area SA. The separation area SA may be positioned between the through area CA and the barrier area BA. At least one dam 800 may be included on the barrier area BA to block mutual influence between the pixels PA and the through area CA, and between the pixels PA and the separation area SA.

The dam 800 is provided to prevent the organic layer 620 of the encapsulation layer 600 from overflowing into the separation area SA.

At least one separation structure 700 may be positioned in the separation area SA. The separation structure 700 is provided to disconnect the light emitting layer 520. This is because when the light emitting layer 520 is exposed to the outside, it may become a penetration path for moisture. Since the light emitting layer 520 may be exposed to the outside in the separation area SA, the separation structure 700 is required.

The separation structure 700 may be formed of the same material as the second overcoat layer 160 that planarizes an upper portion of the second thin film transistor 300. That is, the separation structure 700 may be formed in a columnar shape with the second overcoat layer 160 on a second intermediate insulating layer 140*b*. In addition, the second intermediate insulating layer 140*b* that is under an outer portion of the separation structure 700 may be removed. A removal process may be performed by a dry etching process or a wet etching process.

When the second intermediate insulating layer 140*b* that is under the outer portion of the separation structure 700 is undercut so as to be removed inwardly, the layer that is deposited on the separation structure 700 (for example, the light emitting layer 520) does not completely cover a lower portion of the outer portion of the separation structure 700, and a connection of the layer that is deposited on the separation structure 700 is broken as shown in FIG. 5. By using such a phenomenon, it is possible to isolate a specific layer by partially removing a layer under the separation structure 700. As described above, since the light emitting layer 520 serves as a transfer path for moisture and may cause a defect in the display device, it is important to completely separate the light emitting layer 520. In order to completely separate the light emitting layer 520, as described above, an undercut needs to be implemented by partially removing the second intermediate insulating layer 140*b* under the separation structure 700. In addition, as a height of an undercut structure increases, the separation of the light emitting layer 520 may be advantageous. That is, a thickness of the second intermediate insulating layer 140*b* may be increased to increase the height of the undercut structure. However, in areas where the pixels PA are positioned, when a thickness of the second intermediate insulating layer 140*a* that is positioned on the second semiconductor pattern 310 of the second thin film transistor 300 is formed to be large for separation of the light emitting layer 520 in the separation area SA of the light emitting layer 520, deterioration of the second semiconductor pattern 310 of the second thin film transistor 300 may occur. That is, when the thickness of the second intermediate insulating layer 140*a* including the silicon nitride-based (SiNx) material increases, hydrogen content of the second intermediate insulating layer 140*a* increases, so that deterioration of the second semiconductor pattern 310 of the second thin film transistor 300 formed of an oxide semiconductor occurs. To prevent this, in the present embodiment, the thickness of the second intermediate insulating layer 140*a* is formed differently in an area where the second thin film transistor 300 is positioned and in the separation area SA. That is, the thickness of the second intermediate insulating layer 140*b* under the separation structure 700 in the separation area SA is formed to be large, and the thickness of the second intermediate insulating layer 140*a* in the area where the second thin film transistor 300 is positioned is formed to be small, so that a phenomenon in which the second semiconductor pattern 310 is deteriorated by reducing hydrogen content of the second intermediate insulating layer 140*a* can be minimized.

After the second intermediate insulating layers 140*a* and 140*b* are formed in the areas where the pixels PA are positioned and the separation area SA, contact holes may be formed to connect the second drain electrode 360 and the second semiconductor pattern 310 and connect the second source electrode 350 and the second semiconductor pattern 310 of the second thin film transistor. When a photolithography process is performed where contact holes are not formed in the areas in which the pixels PA are positioned, the second intermediate insulating layer 140*a* having a thickness smaller than the second intermediate insulating layer 140*b* positioned in the separation area SA may be formed using a half-tone mask or a slit mask. Here, a method using a half-tone mask or a slit mask is exemplified, but the present disclosure is not limited thereto.

The exemplary embodiments of the present disclosure can also be described as follows:

According to an aspect of the present disclosure, there is provided a display device. The display device comprises a substrate having an active region and an outer region surrounding the active region, a substrate hole provided in the active region of the substrate, a separation area positioned between the active region and the substrate hole, a first thin film transistor provided in the active region, a first interlayer insulating layer covering a first gate electrode of the first thin film transistor, a first intermediate insulating layer on the first interlayer insulating layer, a second thin film transistor positioned on the first intermediate insulating layer, a second interlayer insulating layer covering a second gate electrode of the second thin film transistor and extending to the separation area, and a second intermediate insulating layer covering an upper portion of the second interlayer insulating layer and extending to the separation area. The second intermediate insulating layer has different thicknesses in the active region and the separation area.

The thickness of the second intermediate insulating layer in the separation area may be greater than the thickness of the second intermediate insulating layer in the active region.

The second intermediate insulating layer may be formed of silicon nitride (SiNx).

The display device may further comprise a first overcoat layer and a second overcoat layer that are on the second intermediate insulating layer and sequentially stacked to remove a step difference caused by the first and second thin film transistors.

The display device may further comprise a separation structure disposed in the separation area and provided to disconnect an organic light emitting layer.

The separation structure may be formed of the same material as the second overcoat layer.

The second intermediate insulating layer under the separation structure may be etched inward from an outer portion of the separation structure.

The separation structure may be positioned to surround the substrate hole.

The display device may further comprise an encapsulation part covering the active region and the separation area, and including a first inorganic layer, an organic layer, and a second inorganic layer.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
   a substrate having an active region and an outer region surrounding the active region;
   a substrate hole provided in the active region of the substrate;
   a separation area positioned between the active region and the substrate hole;
   a first thin film transistor provided in the active region;
   a first interlayer insulating layer covering a first gate electrode of the first thin film transistor;
   a first intermediate insulating layer on the first interlayer insulating layer;
   a second thin film transistor positioned on the first intermediate insulating layer;
   a second interlayer insulating layer covering a second gate electrode of the second thin film transistor and extending to the separation area;
   a second intermediate insulating layer including a first portion in the active region that covers an upper portion of the second interlayer insulating layer in the active region that covers the second gate electrode of the second thin film transistor and a second portion in the separation area that is disconnected from the first portion of the second intermediate insulating layer; and
   a separation structure disposed on the second portion of the second intermediate insulating layer in the separation area and disconnecting an organic light emitting layer,
   wherein the second intermediate insulating layer under the separation structure is etched inward from an outer portion of the separation structure to form undercut structure,
   wherein a thickness of the second portion of the second intermediate insulating layer in the separation area is greater than a thickness of the first portion of the second intermediate insulating layer in the active region.

2. The display device of claim 1, wherein the second intermediate insulating layer is formed of silicon nitride (SiNx).

3. The display device of claim 1, further comprising: a first overcoat layer and a second overcoat layer that are disposed on the second intermediate insulating layer and sequentially stacked.

4. The display device of claim 3, wherein the separation structure is formed of a same material as the second overcoat layer.

5. The display device of claim 1, wherein the separation structure is positioned to surround the substrate hole.

6. The display device of claim 5, further comprising: an encapsulation part covering the active region and the separation area, and the encapsulation part including a first inorganic layer, an organic layer, and a second inorganic layer.

7. The display device of claim 1, wherein the first portion of the second intermediate insulating layer is between the second interlayer insulating layer that covers the second gate electrode and a portion of a drain electrode and a portion of a source electrode of the second thin film transistor in the active region.

8. A display device, comprising:
   a substrate having an active region and an outer region surrounding the active region;
   a substrate hole provided in the active region of the substrate;
   a separation area positioned between the active region and the substrate hole;
   a thin film transistor provided in the active region;
   an insulating layer including a first portion in the active region that covers the thin film transistor in the active region and a second portion in the separation area that is disconnected from the first portion; and a separation structure disposed on the second portion of the insulating layer in the separation area and disconnecting an organic light emitting layer, wherein the insulating layer under the separation structure is etched inward from an outer portion to form undercut structure, wherein the second portion of the insulating layer in the active region has a greater thickness than the first portion of the insulating layer in the separation area.

9. A display device, comprising:

a substrate comprising a plurality of pixels in an active region, each of the plurality of pixels comprising a light emitting element which includes a light emitting layer;

a substrate hole provided in the substrate in the active region;

a driving circuit comprising a plurality of thin film transistors to control an operation of the light emitting element;

a separation area surrounding the substrate hole, the separation area comprising a separation structure, wherein the separation structure disconnects the light emitting layer; and an insulating layer including a first portion in the active region that overlaps a portion of a thin film transistor from the plurality of thin film transistors and a second portion that overlaps the separation structure in the separation area, the second portion of the insulating layer in the separation area disconnected from the first portion of the insulating layer in the active region, wherein the insulating layer under the separation structure is etched inward from an outer portion to form undercut structure.

* * * * *